US009900018B1

United States Patent
Chen et al.

(10) Patent No.: US 9,900,018 B1
(45) Date of Patent: Feb. 20, 2018

(54) METHODS AND SYSTEMS FOR REDUCING TRANSIENT KICKBACK FROM AN ANALOG-TO-DIGITAL CONVERTER

(71) Applicant: Marvell International Ltd., Hamilton (BM)

(72) Inventors: Song Chen, Shanghai (CN); Lei Luo, Shanghai (CN); Tianfeng Ye, Shanghai (CN); Ran Li, Shanghai (CN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/656,458

(22) Filed: Jul. 21, 2017

Related U.S. Application Data

(60) Provisional application No. 62/437,549, filed on Dec. 21, 2016.

(51) Int. Cl.
*H03M 1/06* (2006.01)
*H03M 1/08* (2006.01)

(52) U.S. Cl.
CPC .................................. *H03M 1/08* (2013.01)

(58) Field of Classification Search
CPC ....................................................... H03M 1/08
USPC .................................................. 341/118–155
See application file for complete search history.

(56) References Cited

U.S. PATENT DOCUMENTS

| | | | |
|---|---|---|---|
| 6,710,728 B2* | 3/2004 | Gude | H03M 3/368 |
| | | | 341/143 |
| 9,628,075 B2* | 4/2017 | Cebi | H03K 17/687 |
| 2004/0214545 A1* | 10/2004 | Kushima | H03G 3/3036 |
| | | | 455/232.1 |
| 2006/0068741 A1* | 3/2006 | Kamath | H03F 1/26 |
| | | | 455/307 |
| 2006/0068742 A1* | 3/2006 | Chandra | H03H 11/126 |
| | | | 455/307 |
| 2014/0009214 A1* | 1/2014 | Altunkilic | H03K 17/161 |
| | | | 327/427 |
| 2015/0022256 A1* | 1/2015 | Sprinkle | H03K 17/161 |
| | | | 327/379 |

* cited by examiner

*Primary Examiner* — Lam T Mai

(57) ABSTRACT

Embodiments described herein provide circuitry for reducing input distortion at a buffer due to large signal swings. The circuitry includes an analog-to-digital converter (ADC), a first buffer, a low pass filter, and a second buffer. The ADC is configured to convert an analog input to a digital output. The first buffer is coupled to an input node of the ADC and the low pass filter is coupled to an output of a driving circuit and an input to the first buffer. The second buffer placed in proximity to the first buffer. An input of the second buffer is connected to an output of the driving circuit and an output of the second buffer is connected to a feedback component of the driving circuit.

21 Claims, 3 Drawing Sheets

METHODS AND SYSTEMS FOR REDUCING TRANSIENT KICKBACK FROM AN ANALOG-TO-DIGITAL CONVERTER

CROSS-REFERENCE TO RELATED APPLICATION

This disclosure claims the benefit under 35 U.S.C. § 119(e) of U.S. Provisional Patent Application No. 62/437,549, filed Dec. 21, 2016, which is hereby incorporated by reference herein in its entirety.

FIELD OF USE

This disclosure relates to analog-to-digital circuit designs, and specifically, to a mechanism that reduces transient kickback from an analog-to-digital converter.

BACKGROUND OF THE DISCLOSURE

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

An analog-to-digital converter (ADC) is an electronic component that converts an analog signal into a digital signal. For example, a sound collected by a microphone or light captured by a digital camera is received in the form of an analog signal, and is converted into a digital signal by the ADC for processing. The analog signal is usually passed through a driving circuit, such as a filter, a programmable amplifier (PGA) or a transimpedance amplifier (TIA) before being fed into the ADC.

The ADC usually includes one or more latched comparators, which generate a digital output indicating whether a differential analog input signal is positive or negative. A switch is usually used in the latched comparator to operate the latched comparator in different phases. When a switching event takes place, the resulting voltage variation within the comparator can be coupled to the input of the comparator through parasitic capacitances of the transistors within the comparator. As the driving circuit preceding the ADC usually has a non-zero output impedance, the input signal of the ADC is disturbed and such disturbance is usually referred to as the kickback noise.

In a switch cap input ADC, a large value of capacitor array can be switched at the same time, the resulting kickback noise may be non-negligible and thus may affect the input and reference voltages of the ADC, which impairs the accuracy of the ADC. To avoid the kickback noise being fed into the ADC, sometimes the driving circuit preceding the ADC is designed to absorb the kickback noise. Redesigning driving circuit may impose burden to circuit engineers if every driving circuit preceding every ADC needs to be redesigned. Also, a redesigned driving circuit that is configured to absorb kickback noise may require more circuit area and power.

SUMMARY

Embodiments described herein provide circuitry for reducing input distortion at a buffer due to large signal swings. The circuitry includes an analog-to-digital converter (ADC), a first buffer, a low pass filter, and a second buffer. The ADC is configured to convert an analog input to a digital output. The first buffer is coupled to an input node of the ADC and the low pass filter is coupled to an output of a driving circuit and an input to the first buffer. The second buffer placed in proximity to the first buffer. An input of the second buffer is connected to an output of the driving circuit and an output of the second buffer is connected to a feedback component of the driving circuit.

In some implementations, the first buffer and the second buffer are identical.

In some implementations, the first buffer and the second buffer have a same structure except that the second buffer has a smaller gain than the first buffer.

In some implementations, the circuitry further includes a loading device connected to the input of the ADC. The loading device is configured to match a first load of the first buffer with a second load of the second buffer.

In some implementations, the second buffer is configured to pass, an input voltage including a distortion component due to signal swings, to the feedback component of the driving circuit.

In some implementations, the driving circuit includes at least one of a filter, a programmable amplifier, and a transimpedance amplifier.

In some implementations, the driving circuit has an amplification component having an amplification gain, and the feedback component has a feedback loop gain. The feedback loop gain and the amplification gain are selected in a way that the distortion component multiplied by the feedback loop gain and the amplification gain compensates for the distortion component at the input voltage.

In some implementations, the low pass filter has predetermined coefficients selected to filter thermal noise components amplified by the feedback loop gain and the amplification gain.

In some implementations, the low pass filter is configured to isolate noise components output from the driving circuit from the ADC even when the first buffer is nonlinear.

In some implementations, the circuitry is built on any of a printed circuit board or an integrated circuit.

Embodiments described herein provide a method for reducing input distortion at a buffer due to large signal swings. At an ADC, a first analog signal is received from a first buffer. The first analog signal is converted, by the analog-to-digital converter, into a digital signal. Disturbance to the first analog signal, caused by large signal swings, is reduced by: passing a second analog signal from a driving circuit through a low pass filter and the first buffer in sequence to obtain the first analog signal, and passing the second analog signal to a second buffer that is coupled to a feedback component of the driving circuit such that the second analog signal is routed back to an input node of the driving circuit via the second buffer and the feedback component.

Embodiments described herein provide another method for reducing input distortion at a buffer due to large signal swings. An ADC is formed to convert an analog input to a digital output on a circuit. A first buffer is formed to connect to an input node of the ADC. A low pass filter is placed between a driving circuit and the first buffer. A second buffer is placed in proximity to the first buffer. An input of the second buffer is connected to an output of the driving circuit and an output of the second buffer is connected to a feedback component of the driving circuit.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for reducing transient kickback from an analog-to-digital converter (ADC).

Transient kickback noise can be generated due to capacitor switching in an ADC. In some implementations, to reduce the transient kickback noise, an input buffer is inserted between the ADC and the driving circuit preceding the ADC to isolate the transient kickback noise. In this way, the driving circuit, i.e., a PGA, a TIA, or a filter, does not need to be designed to tackle the transient kickback issue. However, when the amplitude of the input analog signal is large, the input buffer may exhibit low linearity and thus the performance of the buffer to isolate transient kickback noise is impaired.

Embodiments herein describe a double-buffer structure to stably isolate the ADC and the preceding circuit even when either or both of the buffers employed are nonlinear when the amplitude of the input analog signal is relatively large. For example, the two buffers can be chosen to be with similar characteristics, with one buffer being placed at the input of the ADC to isolate the ADC from kickback noise, and the other buffer being placed as part of the feedback loop of the preceding circuit. Thus when the buffer being placed out of the feedback loop is affected by large signal swing, the other buffer at the feedback loop may track the distortion of the first buffer. In this way, even when the signal amplitude is relatively large and the buffers are not strictly linear, the feedback loop can adjust the input of the buffer to improve the linearity.

Figure 1:
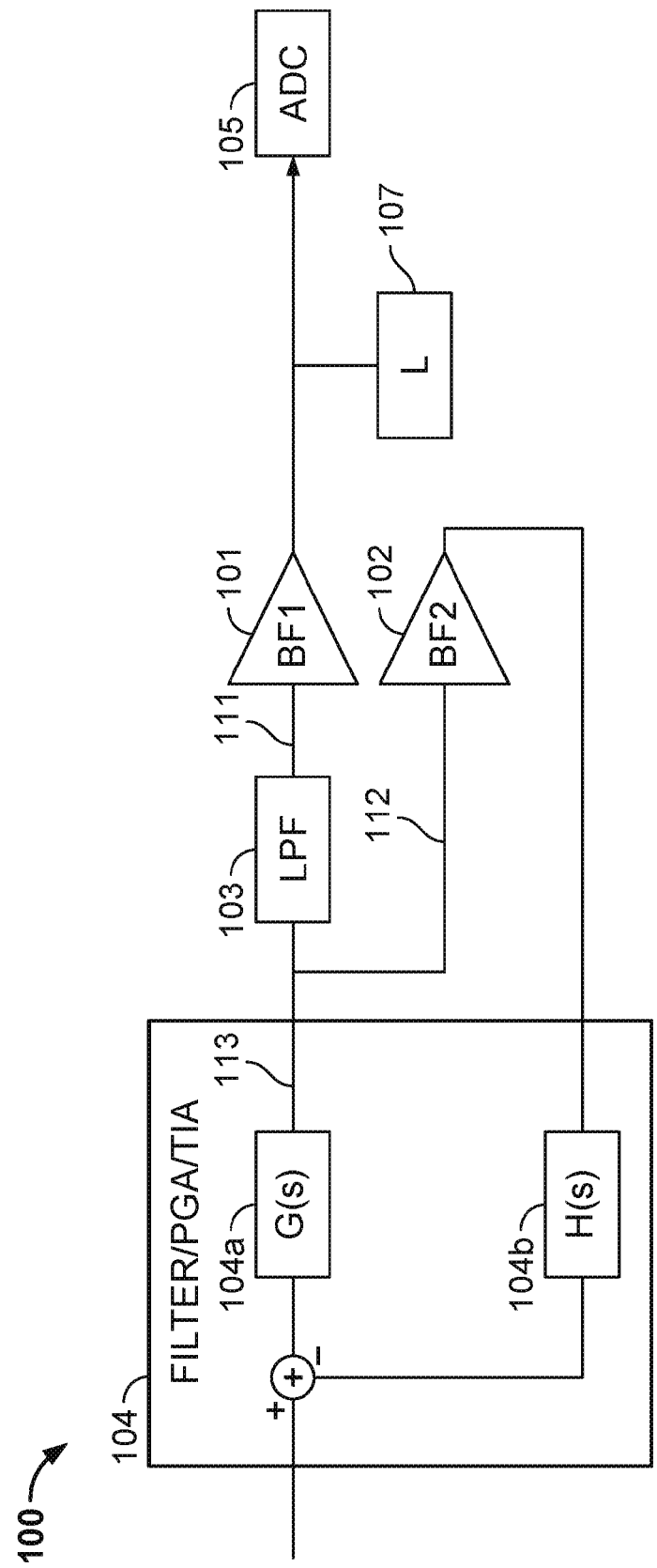
FIG. 1 is a block diagram illustrating an example circuit structure employing two open-loop buffers and a low pass filter (LPF) to reduce the effect of transient kickback noise for an analog-to-digital (ADC) converter, according to some embodiments described herein.

FIG. 1 provides a block diagram 100 illustrating aspects of a double-buffer structure to isolate transient kickback noise from entering an ADC and improve linearity of the buffers when large signal swing occurs, according to some embodiments described herein. The double-buffer structure includes two open-loop buffers 101 and 102, and an LPF 103 being arranged between the ADC 105 and the preceding circuit 104. A first open-loop buffer 101, which is a source follower, e.g., a buffer amplifier, is configured to be placed right before the ADC 105 input node to isolate the ADC input from any transient kickback noise. Another open-loop buffer 102 is configured to be placed as part of the feedback path 104b of the preceding circuit 104 such that the buffer 102 is configured to drive the feedback of the preceding circuit 104, e.g., the PGA, TIA or filter feedback. In some implementations, the second open-loop buffer 102 is chosen to be identical with the first open-loop buffer 101. In other implementations, the second open-loop buffer 102 is chosen to have the same structure with the first open-loop buffer 101, but the gain of the second open-loop buffer 102 is scaled with a proper ratio (e.g., 0.4, 0.7, etc.) to save power. The second open-loop buffer 102 is placed in proximity to the first-loop buffer 101 such that the input voltages of both buffers 101-102 are affected by the disturbance of kickback noise generated by the ADC 105 when the capacitor switching takes place. An LPF 103 is configured to be placed between the preceding circuit 104, e.g., the PGA, TIA, or filter output, and the first open-loop buffer 101 to filter the kickback noise. A loading device 107 that is used to simulate an electronic load is configured to be placed at the output of the first open-loop buffer 101 such that the output loading of the first open-loop buffer 101 matches the loading of the second open-loop buffer 102.

As the second open-loop buffer 102 is placed in the feedback loop of the preceding circuit 104, e.g., a PGA, TIA or filter, the feedback loop gain may cause nonlinearity of the second open-loop buffer 102 when the signal amplitude of signal 112 is relatively large. Thus, when the second open-loop buffer 102 does not have strict linearity, the first open-loop buffer 101 can be nonlinear as well, as the input signal 111 of the first buffer 101 and the input signal 112 of the second buffer 102 share similar signal amplitude, and the two buffers 101 and 102 have the same structure and similar characteristics except different gains.

Therefore, if the input signal at the first buffer 101 is represented by an input voltage $V_1$, and the input signal at the second buffer 102 is represented by an input voltage $V_2$, when signal swings, the input voltage $V_2$ may be distorted due to the nonlinearity of buffer 102, where the distortion is represented by $\Delta E$, e.g., the input voltage becomes $V_2+\Delta E$ at the second buffer 102. The distortion $\Delta E$ is then passed through the feedback H(s) 104b and the amplifier G(s) of the preceding circuit 104. The output voltage 113 of the amplifier G(s) thus contains the distortion component of $-H(s)G(s)\Delta E$, which may compensate the distortion component $\Delta E$ if the feedback loop H(s) is chosen properly such that $H(s)G(s)\Delta E$ may approximate $\Delta E$. The LPF 103 is configured to filter the thermal noise of the output of the preceding circuit 104. In this way, as the distortion component at the input of buffer 102 is corrected by the feedback loop, noise requirement of the preceding circuit 104 can be relaxed.

Figure 2:
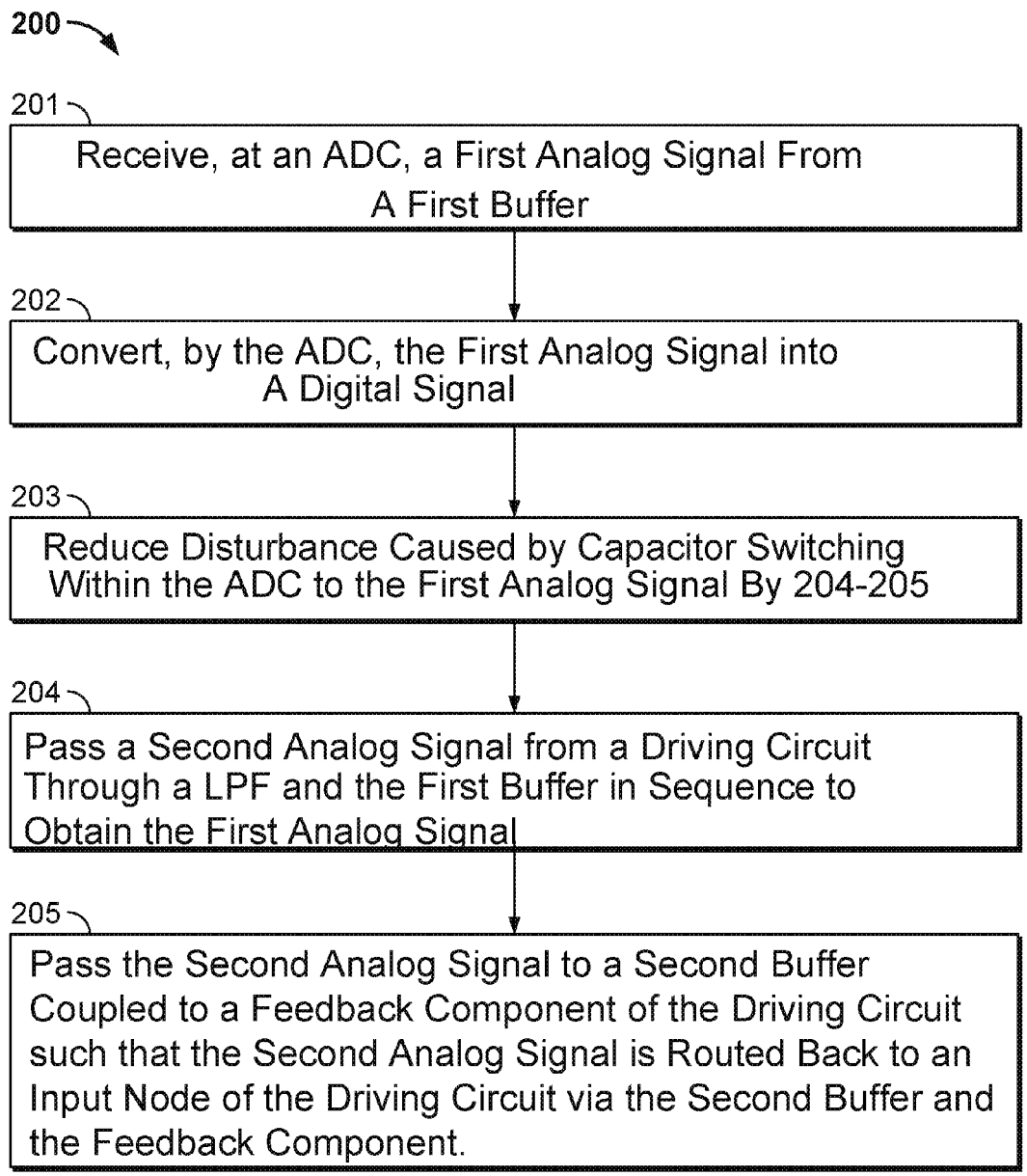
FIG. 2 is a logic flow diagram illustrating aspects of operating a circuit having a double-buffer structure to improve linearity of the buffers when large signal swing occurs, according to some embodiments described herein.

FIG. 2 provides a logic flow diagram 200 illustrating aspects of operating a circuit having a double-buffer structure to isolate transient kickback noise from entering an ADC and improve linearity of the buffers when large signal swing occurs, according to some embodiments described herein. At 201, a first analog signal is transmitted, through a driving circuit (e.g., see 104 in FIG. 1) to generate a second analog signal. At 202, the second analog signal is passed through a low pass filter (e.g., see 103 in FIG. 1) and a first buffer (e.g., see 101 in FIG. 1) in sequence. At 203, the second analog signal is passed to a second buffer (e.g., see 102 in FIG. 1) that is coupled to a feedback component (e.g., 104b in FIG. 1) of the driving circuit such that the second analog signal is routed back to an input node of the driving circuit via the second buffer and the feedback component. At 204, an output signal is received, at an ADC (e.g., see 105 in FIG. 1), from the first buffer. At 205, the output signal is converted, by the ADC, into a digital signal.

Figure 3:
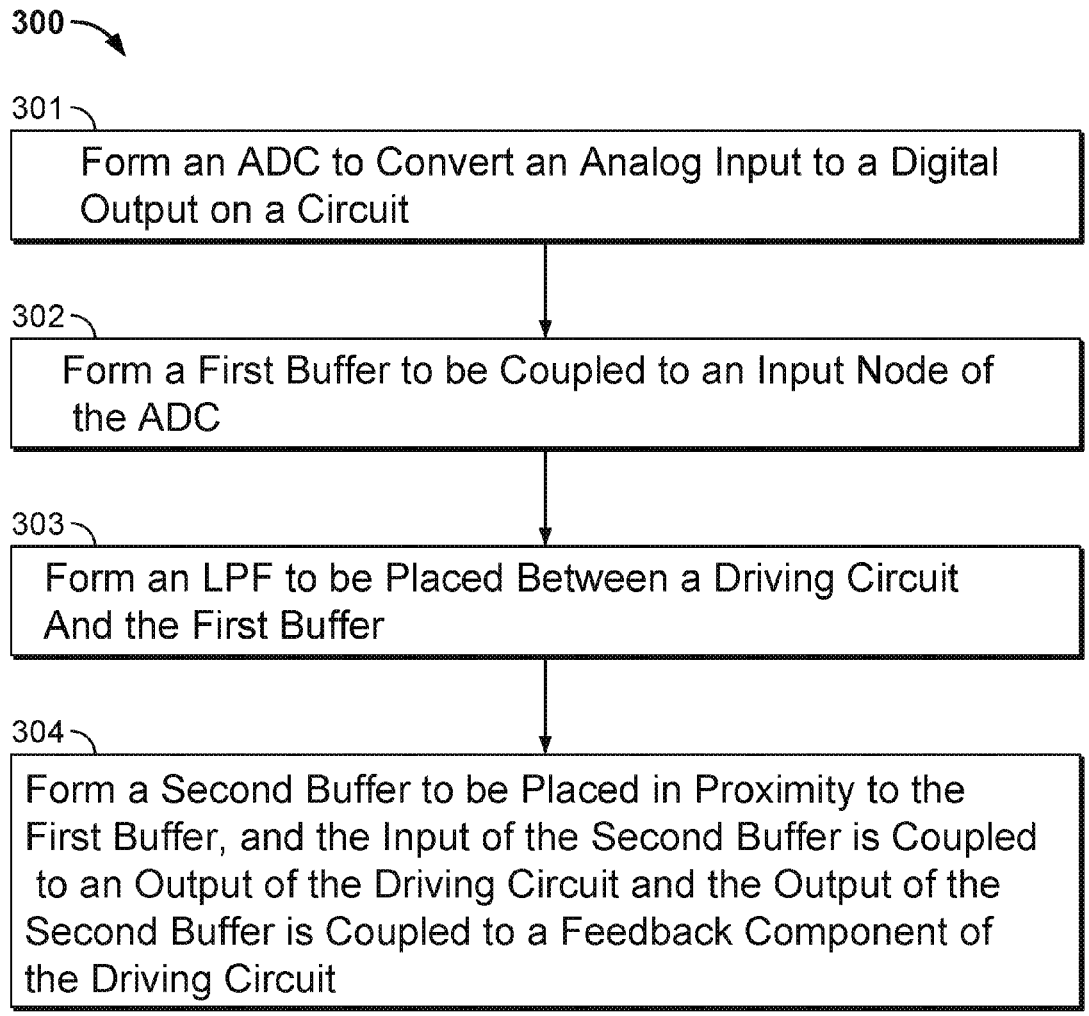
FIG. 3 provides a logic flow diagram illustrating aspects of forming and/or configuring a circuit having a double-buffer structure to improve linearity of the buffers when large signal swing occurs, according to some embodiments described herein.

FIG. 3 provides a logic flow diagram 300 illustrating aspects of forming and/or configuring a circuit having a double-buffer structure to isolate transient kickback noise from entering an ADC and improve linearity of the buffers when large signal swing occurs, according to some embodiments described herein. The circuit 100 as shown in FIG. 1, or the circuit being operated by the logic flow 200 in FIG. 2, may be formed and/or configured on a printed circuit board (PCB), or an integrated circuit (IC). For example, at 301, an ADC (e.g., see 105 in FIG. 1) is formed to convert an analog input to a digital output on a circuit. At 302, a first buffer (e.g., see 101 in FIG. 1) is formed to be connected to an input node of the ADC. At 303, a low pass filter (e.g., see 103 in FIG. 1) is formed to be placed between a driving circuit and the first buffer. At 304, a second buffer (e.g., see 102 in FIG. 1) is formed to be placed in proximity to the first buffer such that both inputs of the first and second buffers may be affected by kickback noise from the ADC. The input of the second buffer is connected to an output of the driving circuit (e.g., see 104 in FIG. 1) and the output of the second buffer being connected to a feedback component (e.g., see 104b in FIG. 1) of the driving circuit.

Various embodiments and components disclosed herein are configured to be at least partially operated and/or implemented by transitory or non-transitory processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIG. 2 does not necessarily require the particular order shown, or sequential order, to achieve desirable results. In certain implementations, multitasking and parallel processing may be advantageous. Other variations are within the scope of the following claims.

What is claimed is:

1. Circuitry for reducing input distortion at a buffer due to large signal swings, comprising:
   an analog-to-digital converter configured to convert an analog input to a digital output;
   a first buffer coupled to an input node of the analog-to-digital converter;
   a low pass filter coupled to an output of a driving circuit and an input to the first buffer; and
   a second buffer placed in proximity to the first buffer, an input of the second buffer being connected to an output of the driving circuit and an output of the second buffer being connected to a feedback component of the driving circuit.

2. The circuitry of claim 1, wherein the first buffer and the second buffer are identical.

3. The circuitry of claim 1, wherein the first buffer and the second buffer have a same structure except that the second buffer has a smaller gain than the first buffer.

4. The circuitry of claim 1, further comprising:
   a loading device connected to the input of the analog-to-digital converter,
      the loading device configured to match a first load of the first buffer with a second load of the second buffer.

5. The circuitry of claim 1, wherein the second buffer is configured to pass, an input voltage including a distortion component due to signal swings, to the feedback component of the driving circuit.

6. The circuitry of claim 1, wherein the driving circuit includes at least one of a filter, a programmable amplifier, and a transimpedance amplifier.

7. The circuitry of claim 5, wherein the driving circuit has an amplification component having an amplification gain, and the feedback component has a feedback loop gain, and wherein the feedback loop gain and the amplification gain are selected in a way that the distortion component multiplied by the feedback loop gain and the amplification gain compensates for the distortion component at the input voltage.

8. The circuitry of claim 7, wherein the low pass filter has pre-determined coefficients selected to filter thermal noise components amplified by the feedback loop gain and the amplification gain.

9. The circuitry of claim 1, wherein the low pass filter is configured to isolate noise components output from the driving circuit from the analog-to-digital converter even when the first buffer is nonlinear.

10. The circuitry of claim 1, wherein the circuitry is built on any of a printed circuit board or an integrated circuit.

11. A method for reducing input distortion at a buffer due to large signal swings, the method comprising:
   receiving, at an analog-to-digital converter, a first analog signal from a first buffer;
   converting, by the analog-to-digital converter, the first analog signal into a digital signal; and
   reducing disturbance to the first analog signal, caused by large signal swings, by:
      passing a second analog signal from a driving circuit through a low pass filter and the first buffer in sequence to obtain the first analog signal, and
      passing the second analog signal to a second buffer that is coupled to a feedback component of the driving circuit such that the second analog signal is routed back to an input node of the driving circuit via the second buffer and the feedback component.

12. The method of claim 11, wherein the first buffer and the second buffer are identical.

13. The method of claim 11, wherein the first buffer and the second buffer have a same structure except that the second buffer has a smaller gain than the first buffer.

14. The method of claim 11, further comprising:
   coupling a loading device to the input of the analog-to-digital converter,
      the loading device being configured to match a first loading of the first buffer with a second loading of the second buffer.

15. The method of claim 11, further comprising:
   passing, via the second buffer, a distortion component as part of an input voltage of the second buffer, to the feedback component of the driving circuit when the distortion component is caused by large signal swings.

16. The method of claim 11, wherein the driving circuit includes any of a filter, a programmable amplifier, and a transimpedance amplifier.

17. The method of claim 15, further comprising:
configuring the driving circuit with an amplification component having an amplification gain, and the feedback component with a feedback loop gain; and
selecting the feedback loop gain and the amplification gain in a way that the distortion component multiplied by the feedback loop gain and the amplification gain compensates for the distortion component at the input voltage.

18. The method of claim 17, wherein the low pass filter has pre-determined coefficients selected to filter noise components amplified by the feedback loop gain and the amplification gain.

19. The method of claim 11, further comprising:
isolating, by the low pass filter, noise components output from the driving circuit, from the analog-to-digital converter even when the first buffer is nonlinear.

20. The method of claim 11, further comprising:
forming the first buffer, the second buffer, and the low pass filter on any of a printed circuit board or an integrated circuit.

21. A method for reducing input distortion at a buffer due to large signal swings, the method comprising:
forming an analog-to-digital converter to convert an analog input to a digital output on a circuit;
forming a first buffer connected to an input node of the analog-to-digital converter;
forming a low pass filter placed between a driving circuit and the first buffer; and
forming a second buffer placed in proximity to the first buffer, an input of the second buffer being connected to an output of the driving circuit and an output of the second buffer being connected to a feedback component of the driving circuit.

* * * * *